(12) United States Patent
Tokunaga et al.

(10) Patent No.: US 11,339,010 B2
(45) Date of Patent: May 24, 2022

(54) SWIRL-FLOW FORMING BODY

(71) Applicant: HARMOTEC CO., LTD., Kofu (JP)

(72) Inventors: Hideyuki Tokunaga, Kofu (JP); Katsuhiro Koshiishi, Kofu (JP); Hidemitsu Tanaka, Kofu (JP); Hitoshi Iwasaka, Kofu (JP)

(73) Assignee: HARMOTEC CO., LTD., Kofu (JP)

( * ) Notice: Subject to any disclaimer, the term of this patent is extended or adjusted under 35 U.S.C. 154(b) by 133 days.

(21) Appl. No.: 16/769,063

(22) PCT Filed: Apr. 3, 2019

(86) PCT No.: PCT/JP2019/014736
§ 371 (c)(1),
(2) Date: Jun. 2, 2020

(87) PCT Pub. No.: WO2019/198582
PCT Pub. Date: Oct. 17, 2019

(65) Prior Publication Data
US 2021/0229935 A1 Jul. 29, 2021

(30) Foreign Application Priority Data

Apr. 12, 2018 (JP) .............................. JP2018-076810

(51) Int. Cl.
*B65G 47/91* (2006.01)
*B25J 15/06* (2006.01)
(Continued)

(52) U.S. Cl.
CPC .......... *B65G 47/91* (2013.01); *B25J 15/0675* (2013.01); *B65G 47/911* (2013.01);
(Continued)

(58) Field of Classification Search
CPC ...... B65G 47/91; B65G 47/911; B65G 49/61; B65G 2201/022; H01L 21/67784
(Continued)

(56) References Cited

U.S. PATENT DOCUMENTS 6,099,056 A * 8/2000 Siniaguine .......... H01L 21/6838
294/64.3
6,551,185 B1 4/2003 Miyake et al.
(Continued)

FOREIGN PATENT DOCUMENTS

CN 101740449 B 8/2011
JP 2017-035350 A 2/2017
(Continued)

OTHER PUBLICATIONS

Oct. 30, 2019 Office Action issued in Taiwanese Patent Application No. 108112133.
(Continued)

*Primary Examiner* — Paul T Chin
(74) *Attorney, Agent, or Firm* — Oliff PLC (57) ABSTRACT

A swirl-flow forming body includes a through-hole; a jetting port that is formed on an inner periphery facing the through-hole; a fluid passage that allows fluid to be discharged into the through-hole via the jetting port so as to form a swirl flow that generates negative pressure for applying suction to a target object; and a flange portion that is formed so as to protrude from the inner periphery, the flange portion allowing passage of fluid to which suction is applied by the negative pressure while preventing the fluid discharged via the jetting port from flowing out of the through-hole towards the target object. The inner periphery is formed so as to guide the fluid discharged via the jetting port, in a direction away from the target object, to be discharged from the through-hole.

8 Claims, 9 Drawing Sheets

(51) Int. Cl.
  *B65G 49/06* (2006.01)
  *H01L 21/683* (2006.01)
  *H01L 21/677* (2006.01)
(52) U.S. Cl.
  CPC ...... *B65G 49/061* (2013.01); *H01L 21/67784* (2013.01); *H01L 21/6838* (2013.01); *B65G 2201/022* (2013.01)
(58) Field of Classification Search
  USPC ........................................................ 294/64.3
  See application file for complete search history.

(56) References Cited

U.S. PATENT DOCUMENTS

| | | | | |
|---|---|---|---|---|
| D530,352 S | * | 10/2006 | Iwasaka | ........................ D15/199 |
| 7,360,322 B2 | * | 4/2008 | Iwasaka | ............ H01L 21/67784 |
| | | | | 294/188 |
| 8,905,680 B2 | * | 12/2014 | Lee | ..................... H01L 21/6838 |
| | | | | 406/87 |
| 10,643,881 B2 | * | 5/2020 | Iwasaka | ............ H01L 21/67778 |
| 11,008,180 B2 | * | 5/2021 | Iwasaka | ................ B25J 15/0616 |
| 2003/0033728 A1 | * | 2/2003 | Iwasaka | ............ H01L 21/67784 |
| | | | | 34/576 |
| 2014/0227045 A1 | * | 8/2014 | Iwasaka | ............ H01L 21/68728 |
| | | | | 406/88 |
| 2016/0288334 A1 | * | 10/2016 | Li | ........................ B25J 15/0616 |
| 2016/0300748 A1 | * | 10/2016 | Iwasaka | ................ H01L 21/677 |
| 2016/0300749 A1 | * | 10/2016 | Iwasaka | ................ B65G 49/061 |
| 2016/0300750 A1 | * | 10/2016 | Iwasaka | ................ B65G 49/061 |
| 2018/0065257 A1 | * | 3/2018 | Iwasaka | ............ H01L 21/67766 |
| 2018/0222679 A1 | | 8/2018 | Iwasaka et al. | |
| 2019/0027393 A1 | | 1/2019 | Iwasaka et al. | |
| 2020/0140211 A1 | | 5/2020 | Iwasaka et al. | |

FOREIGN PATENT DOCUMENTS

| | | |
|---|---|---|
| JP | 2017-217733 A | 12/2017 |
| JP | 2018-98450 A | 6/2018 |
| KR | 10-2001-0042385 A | 5/2001 |

OTHER PUBLICATIONS

Oct. 29, 2019 Search Report issued in Taiwanese Patent Application No. 108112133.

Jun. 18, 2019 Search Report issued in International Patent Application No. PCT/JP2019/014736.

Dec. 6, 2021 Extended European Search Report issued in European Patent Application No. 19784785.8.

Dec. 15, 2021 Office Action issued in Korean Patent Application No. 10-2020-7018425.

* cited by examiner

SWIRL-FLOW FORMING BODY

TECHNICAL FIELD

The present invention relates to a swirl-flow forming body for formation of a swirl flow to generate a suction force.

BACKGROUND ART

There is known in the art a device in which Bernoulli's principle is utilized to convey a plate-like member. Patent Document 1 discloses a swirl-flow forming body, which includes a plate-like main body and a through-hole formed at the center of the main body. A swirl flow is formed within the through-hole, whereby a negative pressure is created and a suction force generated for application to an object to be conveyed. In the swirl-flow forming body, fluid flows out of the through-flow along an end face provided in opposing relation to an end face of the object. By this configuration, the outflowing fluid does not collide with the object, thereby enabling undulation of the of the object to be controlled.

PRIOR ART DOCUMENT

Patent Document

Patent Document 1: JP 2017-217733 A1

SUMMARY OF THE INVENTION

Problems to be Solved by the Invention

The present invention has been made in view of the above technology, and has as its object stable application of suction to an object.

Means for Solving the Problems

To solve the problem described above, a swirl-flow forming body according to the present invention comprises: a main body; an end face that is formed at the main body and faces a target object to which suction is applied; a hole that opens on the end face; a jetting port that is formed on an inner periphery of the main body, the inner periphery facing the hole; a fluid passage that allows fluid to be discharged into the hole via the jetting port so as to form a swirl flow that generates negative pressure; and a flange portion that is formed so as to protrude from the inner periphery, the flange portion allowing passage of fluid to which suction is applied by the negative pressure while preventing the fluid discharged via the jetting port from flowing out of the hole towards the target object, wherein the inner periphery is formed so as to guide the fluid discharged via the jetting port, in a direction away from the target object, to be discharged from the hole.

Another swirl-flow forming body according to the present invention comprises: a main body; an end face that is formed at the main body and faces a target object to which suction is applied; a hole that opens on the end face; a jetting port that is formed on an inner periphery of the main body, the inner periphery facing the hole; a fluid passage that allows fluid to be discharged into the hole via the jetting port so as to form a swirl flow that generates negative pressure; and a flange portion that is formed so as to protrude from the inner periphery, the flange portion allowing passage of fluid to which suction is applied by the negative pressure while preventing the fluid discharged via the jetting port from flowing out of the hole towards the target object, wherein the fluid passage is formed so as to allow the fluid discharged via the jetting port to flow in a direction away from the target object to be discharged from the hole.

The flange portion may comprise a protruding part that is formed at an end of the flange portion so as to protrude in a direction away from the target object.

The flange portion may comprise a first end face that faces the target object, a second end face opposite to the first end surface, and a through-hole that opens on the first end face and the second end face.

Effects of the Invention

The present invention makes it possible to stably apply suction to an object.

DESCRIPTION OF REFERENCE NUMERALS 1, 1A, 1B . . . swirl-flow forming body, 101, 101A, 101B, 101C, 101D . . . main body, 102 . . . through-hole, 103 . . . first end face, 104 . . . second end face, 105 . . . inner periphery, 106 . . . jetting port, 107 . . . outer periphery, 108 . . . supply port, 109 . . . fluid passage, 110 . . . flange part, 111 . . . cover, 112 . . . spacer, 113 . . . flange part, 114 . . . flange part, 115 . . . flange part, 116 . . . annular plate, 117 . . . annular plate, 118 . . . annular plate, 119 . . . groove part, 120 . . . annular plate, 121 . . . cylindrical body, 1101 . . . first end face, 1102 . . . second end face, 1131 . . . protruding part, 1132 . . . U-shaped groove, 1141 . . . V-shaped groove, 1151 . . . first end face, 1152 . . . second end face, 1153 . . . through-hole, 1171 . . . annular plate main body, 1172 . . . holding member, 1173 . . . claw part, 1181 . . . annular plate main body, 1182 . . . holding member, 1183 . . . claw part, 1201 . . . annular plate main body, 1202 . . . holding member, 1203 . . . claw part

MODES FOR IMPLEMENTING THE INVENTION

1. Embodiment

Figure 1:
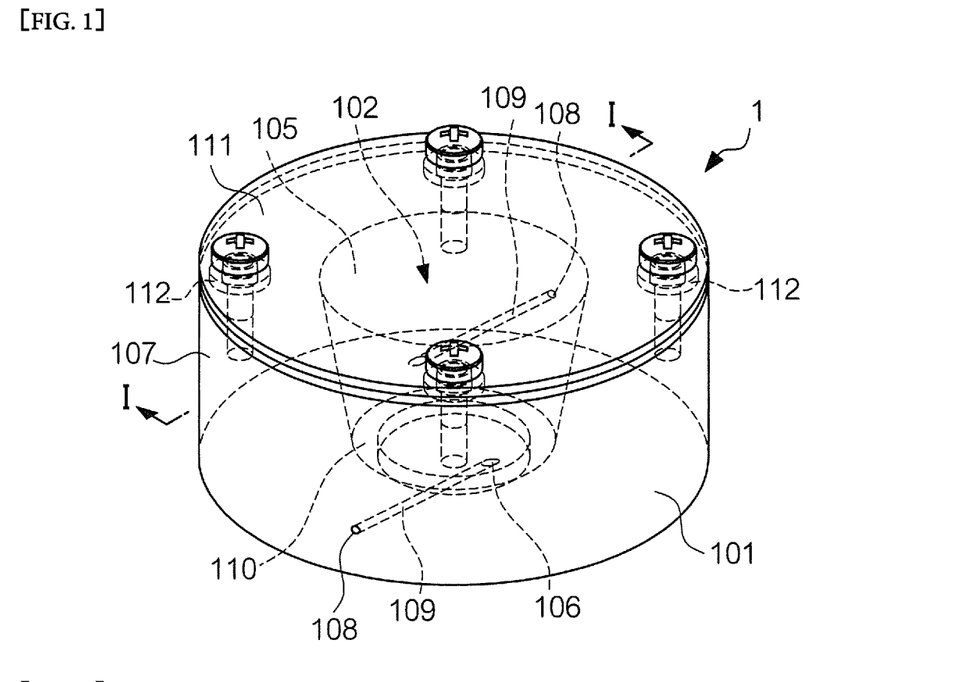
FIG. 1 is a perspective view of an example of an upper surface of swirl-flow forming body 1.
Figure 2:
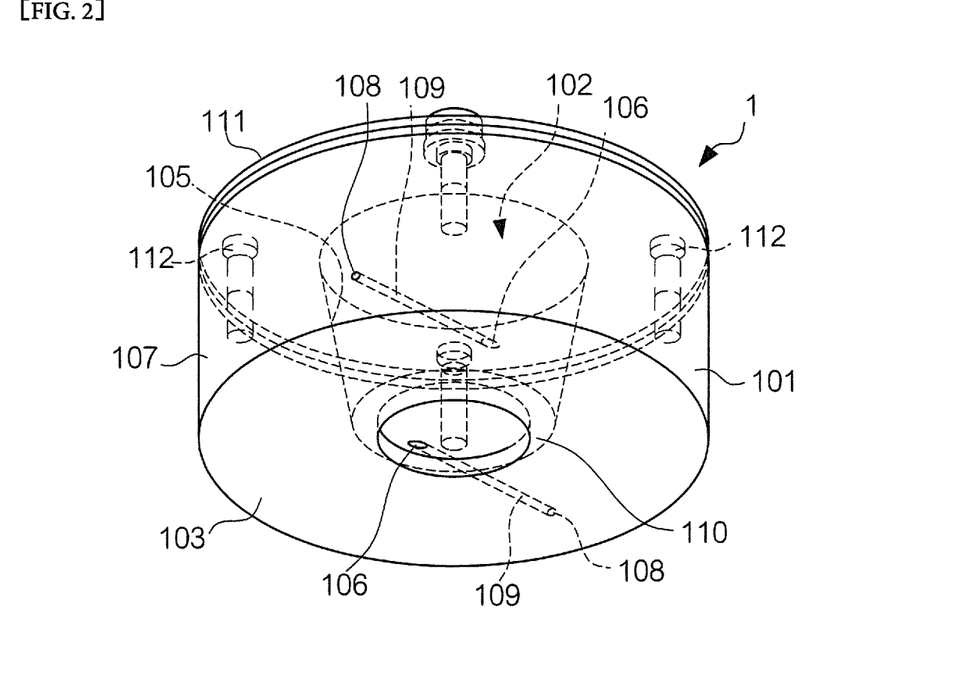
FIG. 2 is a perspective view of an example of a lower surface of swirl-flow forming body 1.
Figure 3:
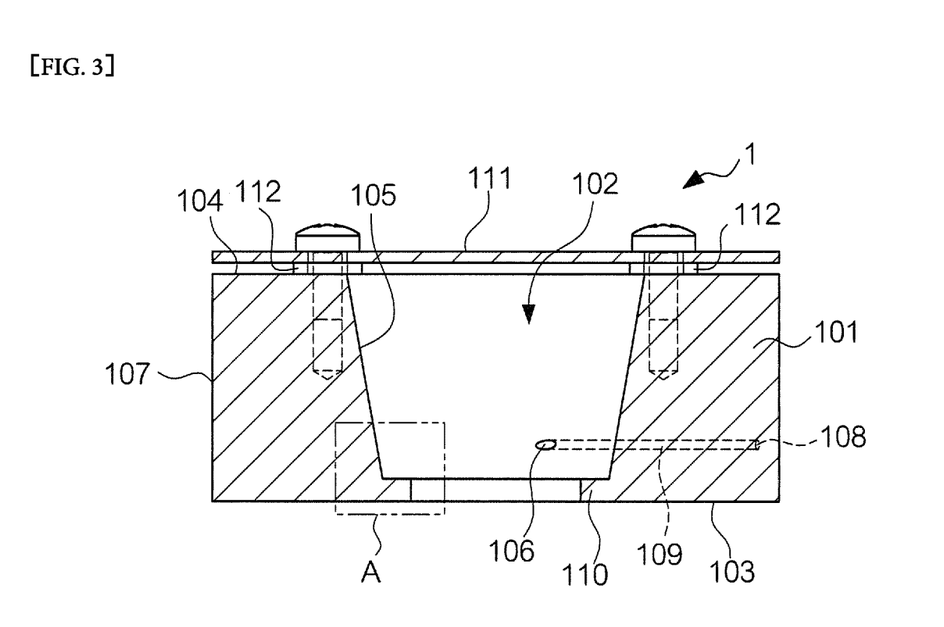
FIG. 3 is a cross-sectional view of swirl-flow forming body 1 along line I-I shown in FIG. 1.
Figure 4:
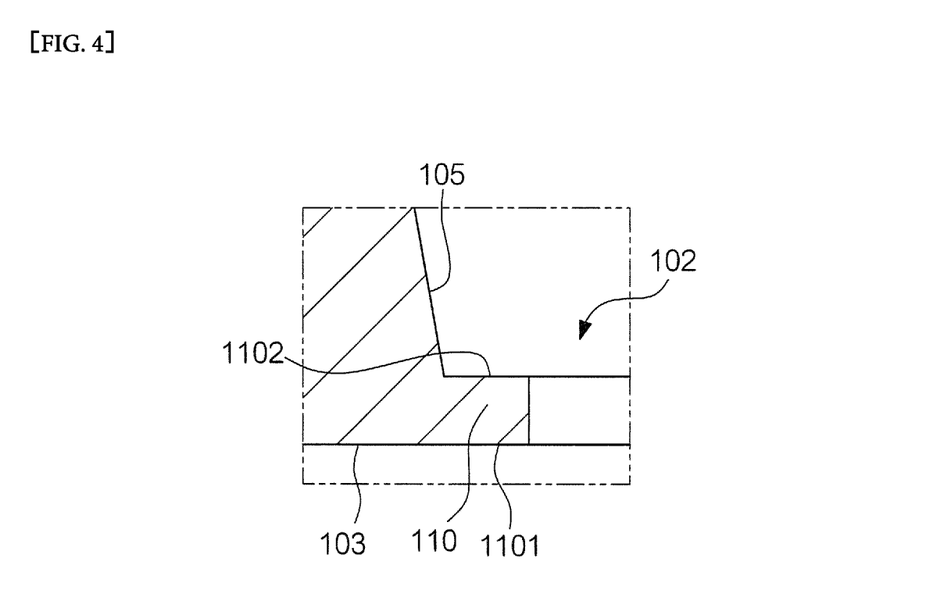
FIG. 4 is an enlarged view of part A shown in FIG. 3.

A swirl-flow forming body 1 according to an embodiment of the present invention will now be described. Swirl-flow forming body 1 is a device in which Bernoulli's principle is utilized for applying suction to a member such as a semiconductor wafer or a food, so that the member can be held and conveyed. FIG. 1 is a perspective view of an example of an upper surface of swirl-flow forming body 1. FIG. 2 is a perspective view of an example of a lower surface of swirl-flow forming body 1. FIG. 3 is a cross-sectional view of swirl-flow forming body 1 along line I-I shown in FIG. 1. FIG. 4 is an enlarged view of part A shown in FIG. 3.

Swirl-flow forming body 1 shown in these figures includes: main body 101, which is a cylindrical body that is circular in cross-section and includes through-hole 102 formed at the center of the cylindrical body; flat first end face 103, which is formed on the lower surface of main body 101 such that first end face 103 is in opposing relation to a target object; flat second end face 104, which is formed on the upper surface of main body 101; two jetting ports 106, which are formed on inner periphery 105 of main body 101 that faces through-hole 102; two supply ports 108, which are formed on outer periphery 107 of main body 101; two straight fluid passages 109, which connect jetting port 106 and supply port 108; annular flange part 110, which is formed to project substantially vertically from inner periphery 105 and to face a target object; cover 111, which is substantially disk-shaped; and four spacers 112, which serve as members for holding cover 111, such that cover 111 is held in opposing relation and parallel to second end face 104.

Inner periphery 105 of main body 101 is tapered such that a cross-section of inner periphery 105 that is substantially perpendicular to the central axis of main body 101 gradually enlarges from the opening of first end face 103 towards the opening of second end face 104. With this shape, inner periphery 105 guides a fluid discharged from jetting port 106, in a direction away from a target object, to be discharged from through-hole 102. Specifically, inner periphery 105 guides the fluid toward the opening of second end face 104 to be discharged from through-hole 102.

Through-hole 102 is formed so as to extend straight in a direction of the central axis of main body 101. Through-hole 102 opens on first end face 103 and second end face 104.

First end face 103 and second end face 104 are formed so as to be substantially perpendicular to the central axis of main body 101.

Jetting ports 106 are formed in the lower side of inner periphery 105 in a direction of the central axis of main body 101. Jetting ports 106 are arranged in point symmetry about the central axis of main body 101. Supply ports 108 are formed in the lower side of outer periphery 107 in a direction of the central axis of main body 101. Supply ports 108 are arranged in point symmetry about the central axis of main body 101. Each of supply ports 108 is connected to a tube extending from a fluid supply pump (not shown), which supplies a gas such as compressed air, or a liquid such as pure water or carbonated water.

Fluid passages 109 are formed so as to extend substantially perpendicular to the central axis of main body 101, and extend in a direction tangential to the inner periphery of main body 101. Fluid passages 109 extend parallel to each other. Fluid passages 109 discharge a fluid from jetting ports 106 into through-hole 102. The fluid discharged into through-hole 102 flows along the inner periphery of main body 101 due to the Coanda effect, whereby a swirl flow is formed within through-hole 102. Most of the fluid molecules included in the swirl flow flow out of through-hole 102 and then flow along second end face 104 at an angle of approximately 45 degrees to a direction in which fluid passage 109 that has discharged the fluid molecules extends. The swirl flow formed within through-hole 102 entrains a fluid remaining still in the center of through-hole 102, so that negative pressure is generated in the center of through-hole 102. The generated negative pressure applies suction to a target object that opposes first end face 103. It is of note that the above angle of approximately 45 degrees is merely one example. An angle at which fluid molecules flow out of through-hole 102 and then flow along second end face 104 is determined by a diameter or depth of through-hole 102 and a flow speed of the fluid.

Flange portion 110 shown in the figures has a length in a radial direction that is approximately 20 percent of the outer diameter of flange portion 110. Flange portion 110, preferably, has a shorter length in a radial direction because having a shorter length in a radial direction makes it possible that a negative pressure is generated in a wider area. An optimal length in a radial direction depends on a diameter and a depth of through-hole 102, and a flow velocity of fluid. Flange portion 110 shown in the figures has a thickness that is 10 percent of that of main body 101. Flange portion 110, preferably, has a smaller thickness because having a smaller thickness makes it possible that a negative pressure is generated in a wider area. An optimal thickness depends on a strength required of swirl-flow forming body 1. Flange portion 110, as shown in FIG. 4, includes flat first end face 1101 that faces a target object, and flat second end face 1102 opposite to first end surface 1101. The first end face 1101 is substantially flush with first end face 103. Flange portion 110 allows passage of fluid to which suction is applied by a negative pressure generated within through-hole 102; however, flange portion 110 prevents a fluid discharged via jetting port 106 from flowing out of the opening of first end face 103 toward a target object.

Cover 111 covers through-hole 102 to control inflow of external fluid to through-hole 102.

Spacers 112 have a columnar shape. Spacers 112 are provided along the outer edge of second end face 104 at regular intervals such that spacers 112 extend toward cover 111 in a substantially vertical direction to couple main body 101 and cover 111. Spacers 112 are fixed on main body 101 and cover 111 by use of screws, for example. Spacers 112 form, between second end face 104 and cover 111, a flow path that allows a fluid flowing out of through-hole 102 to flow to be discharged out of swirl-flow forming body 1. The height of spacers 112 (that is, the gap between second end face 104 and cover 111) is determined based on the flow amount of fluid supplied from the fluid supply pump to swirl-flow forming body 1. Spacers 112 are preferably provided on second end face 104 so as not to obstruct a flow path of a fluid flowing out of through-hole 102. This is to prevent turbulent flow from occurring due to collision of a fluid flowing out of through-hole 102 and spacers 112. A flow path of a fluid flowing out of through-hole 102 is determined by the diameter or depth of through-hole 102 and flow speed of the fluid. For example, spacers 112 are preferably not provided on a line at approximately 45 degrees to a direction in which fluid passage 109 extends.

When swirl-flow forming body 1 described in the foregoing is supplied with fluid from the fluid supply pump, the fluid passes through supply port 108 and fluid passage 109 to be discharged from jetting port 106 into through-hole 102. Most molecules of the discharged fluid are guided by inner periphery 105 to create an upward swirl flow, and flow out of through-hole 102 along second end face 104. At this time, if a target object is present in a position that opposes first end face 103, inflow of external fluid (specifically, gas or liquid) to through-hole 102 is limited, and the density of fluid molecules per unit volume in the center of the swirl flow lessens due to centrifugal force and the entrainment effect of the swirl flow; namely, negative pressure is generated in the center of the swirl flow. As a result, pressure is applied to the target object by surrounding fluid and gravitates towards first end face 103. Some molecules of the discharged fluid form a downward swirl flow against the guide of inner periphery 105; however, the fluid molecules included in the downward swirl flow are prevented by flange portion 110 from flowing out of the opening of first end face 103. The flow of fluid molecules that have come into contact with flange portion 110 is caused to decelerate by the contact with flange portion 110, and eventually they are caught in the upward swirl flow to be discharged out of through-hole 102 along second end face 104.

As described in the foregoing, in swirl-flow forming body 1, most of the fluid molecules flowing out of through-hole 102 flow along second end face 104 to be discharged, and a small number, if any, of fluid molecules flow along first end face 103 to be discharged, so that fluid is prevented from colliding with a target object. As a result, undulation and rotation of the target object is controlled as compared with a case where fluid is not discharged at the side of second end face 104; in other words, the target object can be stably held and conveyed. Also, occurrence of creases, deformation, or damage in the target object resulting from undulation is controlled. Swirl-flow forming body 1 makes possible use of the suction force of the swirl flow that is formed within the body in isolation.

2. Modifications

The embodiment described above may be modified as described below. It is of note that two or more of the modifications described below may be combined.

2-1. Modification 1

Figure 5:
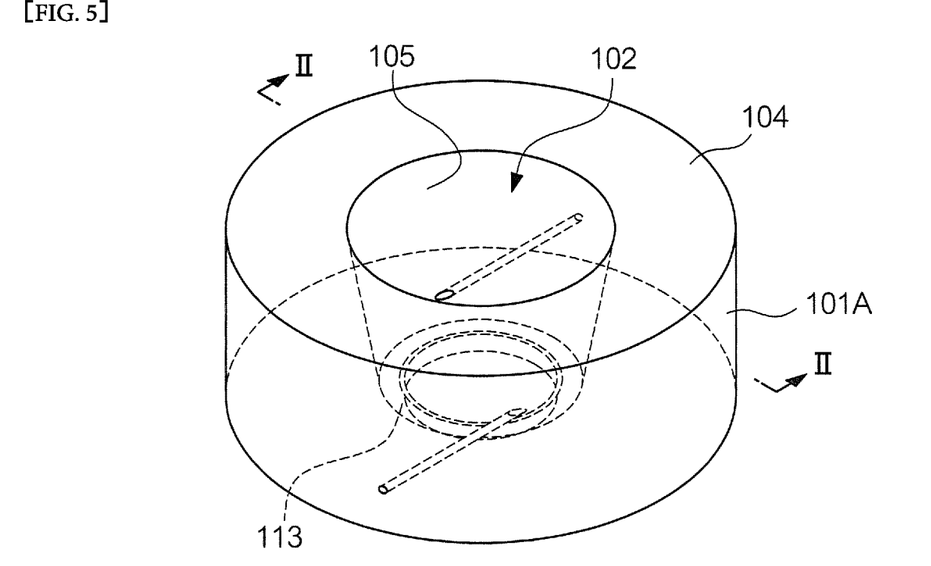
FIG. 5 is a perspective view of an example of an upper surface of main body 101A.
Figure 6:
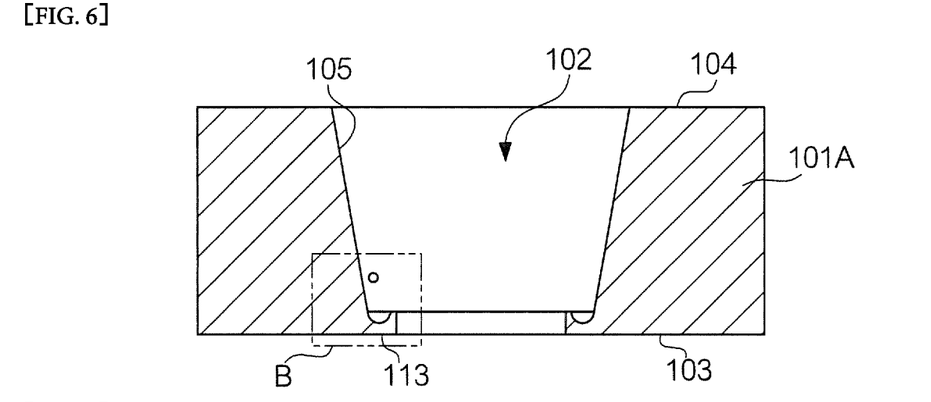
FIG. 6 is a cross-sectional view of main body 101A along line II-II shown in FIG. 5.
Figure 7:
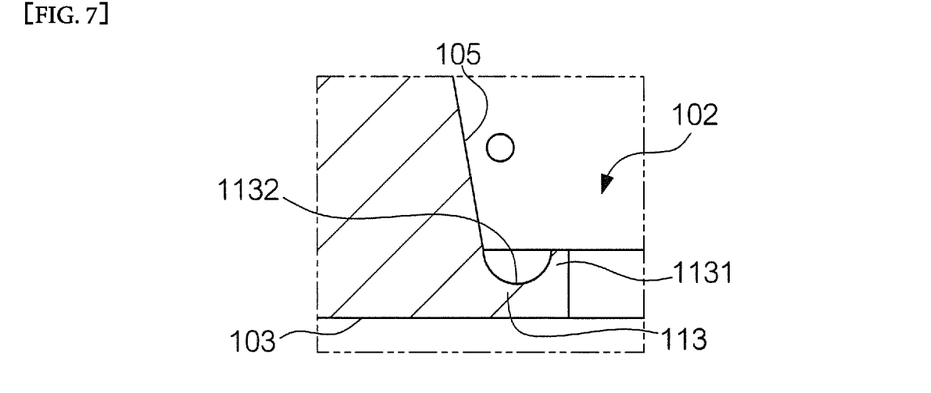
FIG. 7 is an enlarged view of part B shown in FIG. 6.

In the above embodiment, flange portion 110 may have a different shape. FIG. 5 is a perspective view of an example of an upper surface of main body 101A including flange portion 113. FIG. 6 is a cross-sectional view of main body 101A along line II-II shown in FIG. 5. FIG. 7 is an enlarged view of part B shown in FIG. 6. Flange portion 113 shown in the figures has protruding part 1131 that is formed at an end of flange portion 113, and has an annular shape in a planar view. Protruding part 1131 is formed so as to protrude in a direction away from a target object; in other words, protruding part 1131 is formed so as to protrude upward in a direction of the central axis of main body 101A. Protruding portion 1131 shown in the figures has a height that is two times larger than a thickness of flange portion 113. Protruding portion 1131, preferably, has a smaller height because having a smaller height facilitates generation of a negative pressure in a wider area. An optimal height depends on a diameter and a depth of through-hole 102, and a flow velocity of fluid. By forming protruding part 1131 at an end of flange portion 113, U-shaped groove 1132 is formed between protruding part 1131 and inner periphery 105, that has an annular shape in a planar view. A fluid that has reached U-shaped groove 1132 is prevented by protruding part 1131 from moving in a horizontal direction, whereby the fluid is prevented from flowing out of the opening of first end face 103.

Figure 8:
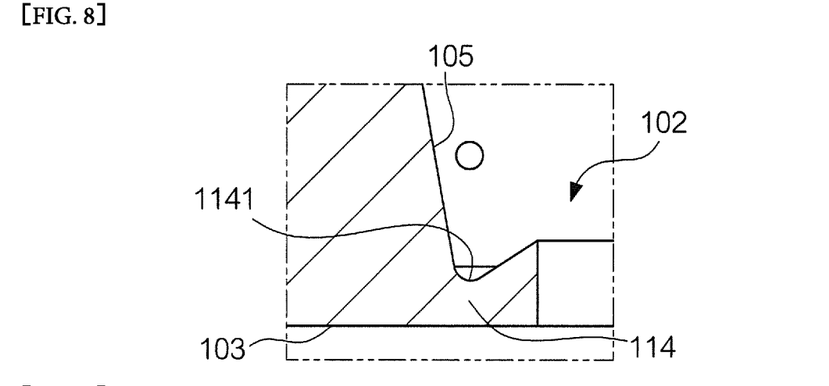
FIG. 8 is an enlarged view of flange part 114.

It is of note that protruding part 1131 and inner periphery 105 may form a groove having a cross-sectional shape other than the U-shape. Protruding part 1131 and inner periphery 105 may form V-shaped groove 1141 as in flange portion 114 shown in FIG. 8.

Figure 9:
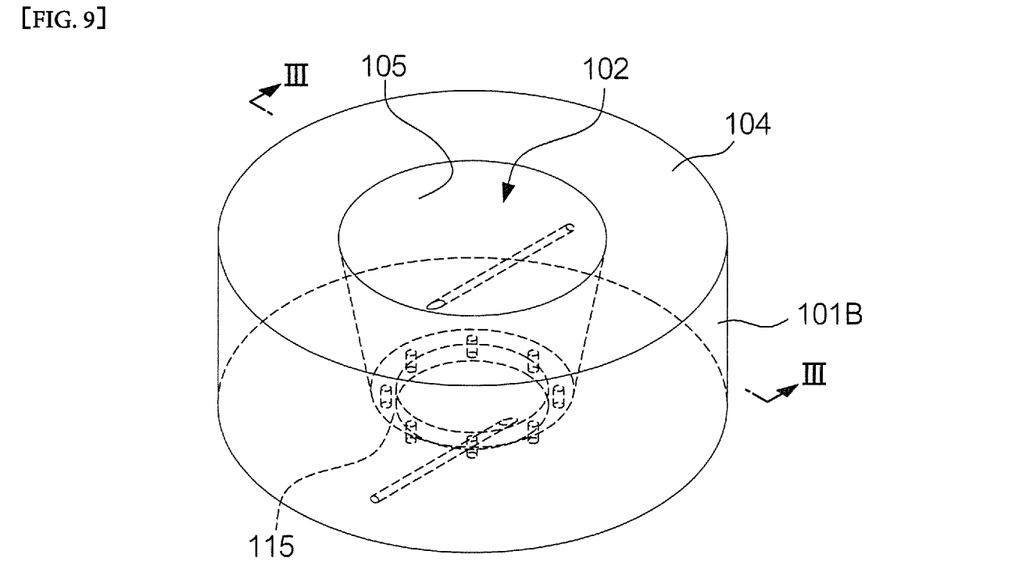
FIG. 9 is a perspective view of an example of an upper surface of main body 101B.
Figure 10:
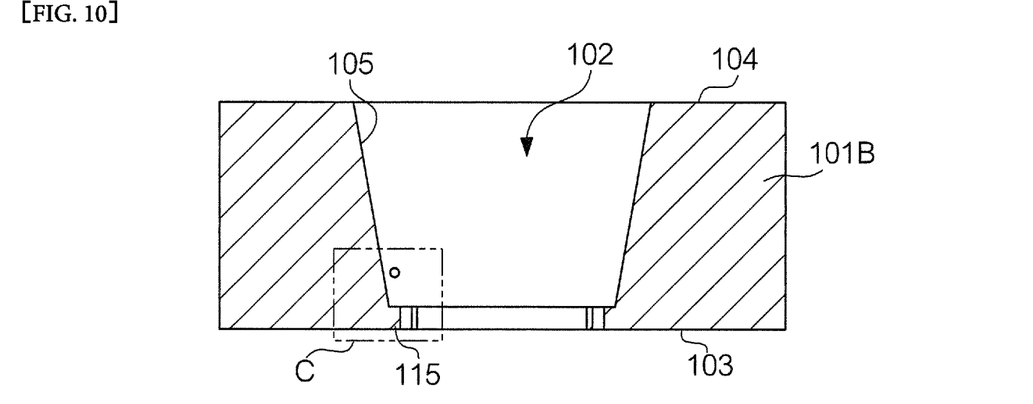
FIG. 10 is a cross-sectional view of main body 101B along line III-III shown in FIG. 9.
Figure 11:
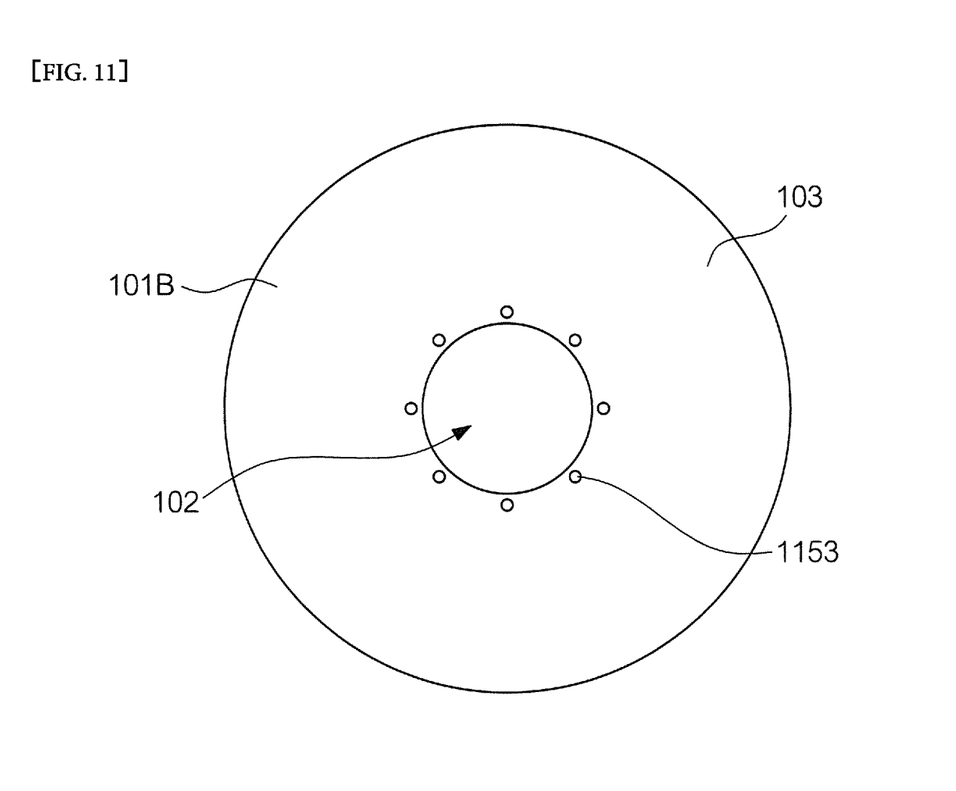
FIG. 11 is a bottom view of main body 101B.
Figure 12:
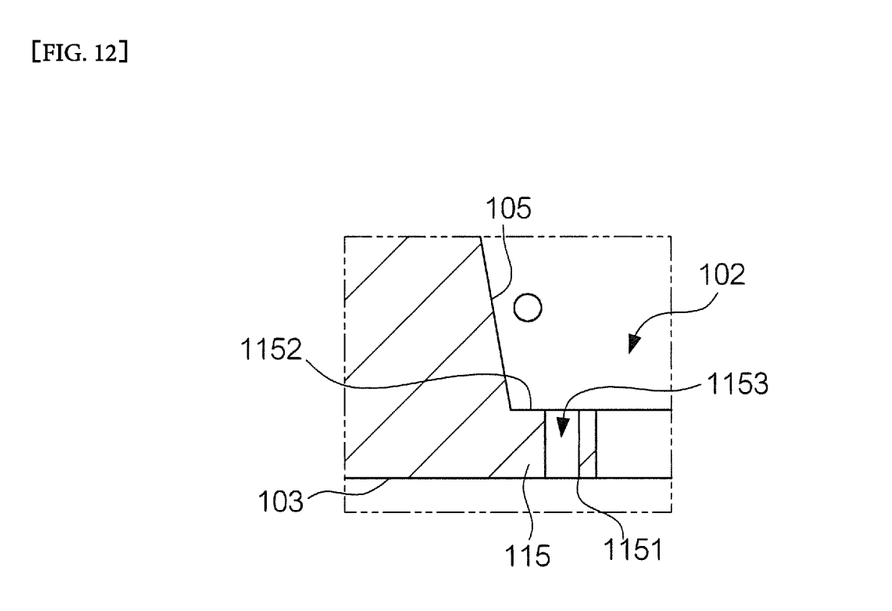
FIG. 12 is an enlarged view of part C shown in FIG. 10.

Another shape of flange portion 110 will be described below. FIG. 9 is a perspective view of an example of an upper surface of main body 101B including flange 115. FIG. 10 is a cross-sectional view of main body 101B along line III-III shown in FIG. 9. FIG. 11 is a bottom view of main body 101B. FIG. 12 is an enlarged view of part C shown in FIG. 10. Flange portion 115 shown in the figures includes flat first end face 1151 that faces a target object, flat second end face 1152 opposite to first end surface 1151, and eight through-holes that open on first end face 1151 and second end face 1152. Each of the through-holes 1153 has a circular cross-section and extends linearly in a direction of the central axis of main body 101B. In a planar view, the through-holes 1153 are arranged at the center in a radial direction of flange portion 115 at regular intervals. When a fluid swirls around on flange portion 115, external fluid is drawn in via each of the through-holes 1153; in other words, a suction force is reinforced by the ejector effect.

It is of note that the number of through holes 1153 is not limited to eight, and may be fewer or may be more. It is also of note that in a planar view, the through-holes 1153 may be arranged on an inner or an outer side in a radial direction, instead of at the center in a radial direction.

2-2. Modification 2

Figure 13:
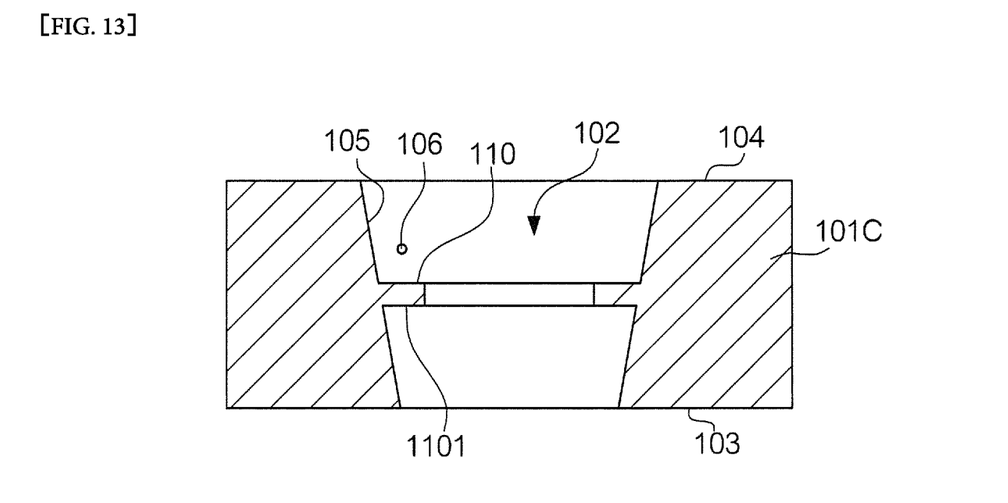
FIG. 13 is a vertical cross-sectional view of main body 101C.

In the above embodiment, flange portion 110 may be provided at a different position on inner periphery 105. More specifically, flange portion 110 may be provided at any position in a vertical direction that is closer to a target object than jetting ports 106. For example, flange portion 110 may be provided in the middle of inner periphery 105, as in main body 101C shown in FIG. 13. Flange portion 110 shown in the figure includes first end face 1101 that is not flush with first end face 103.

2-3. Modification 3

Figure 14:
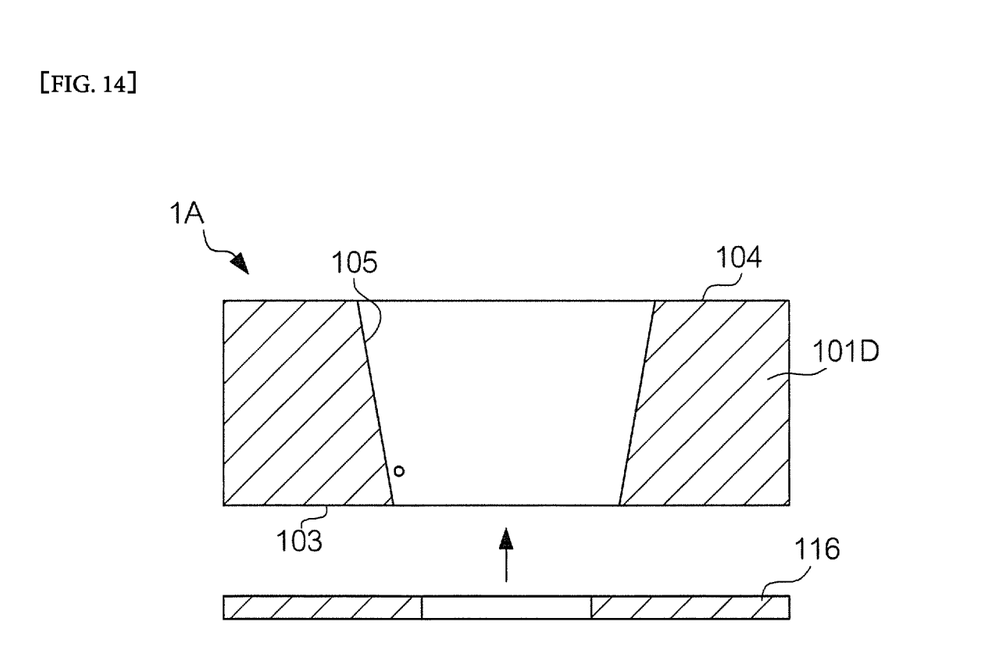
FIG. 14 is a vertical cross-sectional view of an example of swirl-flow forming body 1A.

Swirl-flow forming body 1 may be constituted of two parts that are detachably attached to each other. FIG. 14 is a vertical cross-sectional view of an example of swirl-flow forming body 1A that includes main body 101D that lacks flange portion 110, and annular plate 116 that is detachably attached to main body 101D. Main body 101D shown in the figure is similar to main body 101, with the exception that main body 101D lacks flange portion 110. Annular plate 116 has an outer diameter that is substantially the same as that of main body 101D, and has an inner diameter that is smaller than a diameter of the opening of first end face 103. Annular plate 116 is concentrically attached to main body 101D by use of, for example, screws, such that a surface of annular plate 116 has contact with first end face 103 of main body 101D. Annular plate 116 attached to main body 101D has an inner diameter that is smaller than a diameter of the opening of first end face 103; accordingly, the inner end of annular plate 116 protrudes inwardly relative to inner periphery 105 so that the inner end serves as a flange portion.

In swirl-flow forming body 1A, jetting ports may be provided immediately above the flange portion. In that case, main body 101D may have linear grooves that are formed on first end face 103 and covered by a flat surface of annular plate 116. The linear grooves serve as fluid passages. The fluid passages thus configured are easier to form than fluid passages 109 of the above embodiment.

Figure 15:
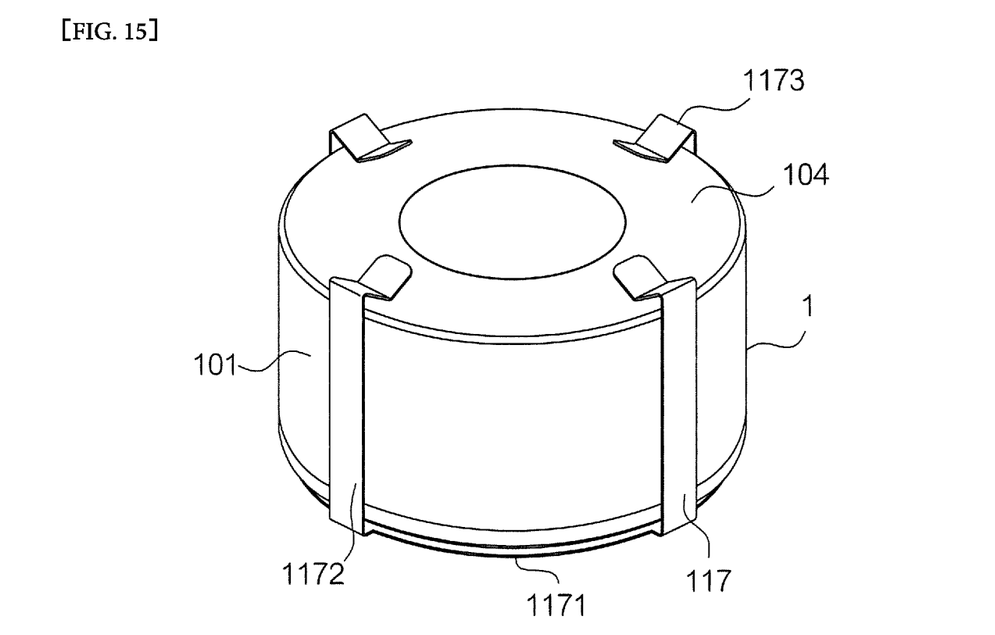
FIG. 15 is a perspective view of an example of swirl-flow forming body 1 to which annular plate 117 is detachably attached.
Figure 16:
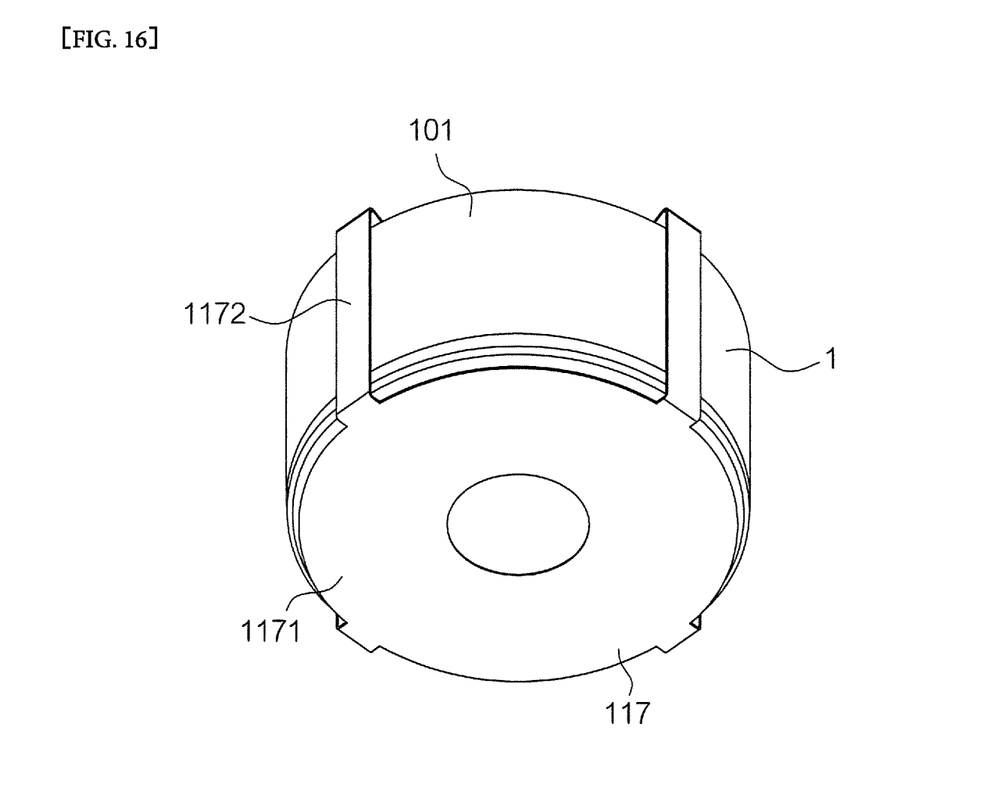
FIG. 16 is another perspective view from a different angle of swirl-flow forming body 1 to which annular plate 117 is detachably attached.

Another method for attaching an annular plate will be described below. FIG. 15 is a perspective view of an example of swirl-flow forming body 1 to which annular plate 117 is detachably attached. FIG. 16 is another perspective view of swirl-flow forming body 1 to which annular plate 117 is detachably attached, as seen from a different angle. Annular plate 117 shown in the figures includes annular plate main body 1171 and four holding members 1172 that can be pushed apart to accommodate and hold swirl-flow forming body 1. Annular plate main body 1171 has an annular shape so as to allow passage of fluid to which suction is applied by swirl-flow forming body 1. Each of the holding members 1172 is detachably fixed on main body 101 at one end thereof, and supports annular plate main body 1171 at the other end thereof such that annular plate main body 1171 opposes first end face 103. Annular plate main body 1171 and the holding members 1172 are integrally formed.

Annular plate main body 1171 is made from a plate spring material and has an annular shape. Annular plate main body 1171 has an outer diameter that is substantially identical to that of first end face 103, and has an inner diameter that is substantially identical to that of first end face 103.

The holding members 1172 are formed by folding elongated plate spring materials that extend from the edge of annular plate main body 1171 at regular intervals, in a direction substantially perpendicular to annular plate main body 1171. The plate spring materials are longer than the length in the axial direction of main body 101. The plate spring materials are folded at an angle such that main body 101 of swirl-flow forming body 1 to which annular plate 117 is attached is pressed at the side surface thereof due to restoring forces (or elastomeric forces) of the holding members 1172, so that main body 101 is held between the holding members 1172. Each of the holding members 1172 includes claw part 1173 at an end thereof, which is to be hooked and fixed on the outer edge of the top surface of main body 101. Claw part 1173 is formed by folding inward one end of a plate spring material in a direction substantially perpendicular to the direction in which the plate spring material extends. The plate spring material is folded at an angle such that main body 101 of swirl-flow forming body 1 to which annular plate 117 is attached is pressed at the top and bottom surfaces thereof due to a restoring force (or an elastomeric force) of claw part 1173, so that main body 101 is held between claw part 1173 and annular plate main body 1171. Claw part 1173 is bent into a V-shape such that, when swirl-flow forming body 1 is provided with annular plate 117, claw part 1173 projects toward the top surface of main body 101.

Annular plate 117 described in the foregoing can be detachably attached to swirl-flow forming body 1 without using a tool.

A modification of annular plate 117 will be described below.

Figure 17:
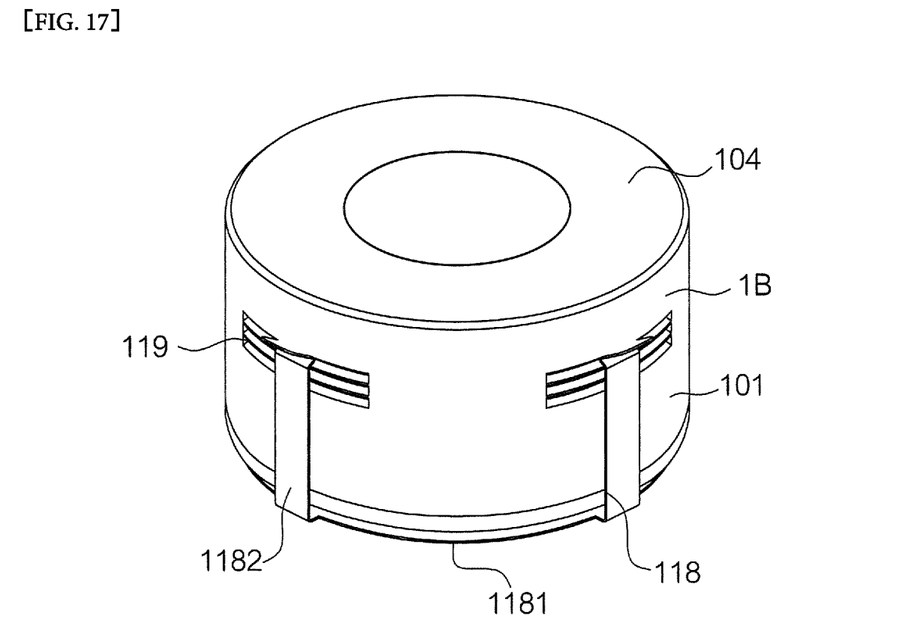
FIG. 17 is a perspective view of an example of swirl-flow forming body 1B to which annular plate 118 is detachably attached.
Figure 18:
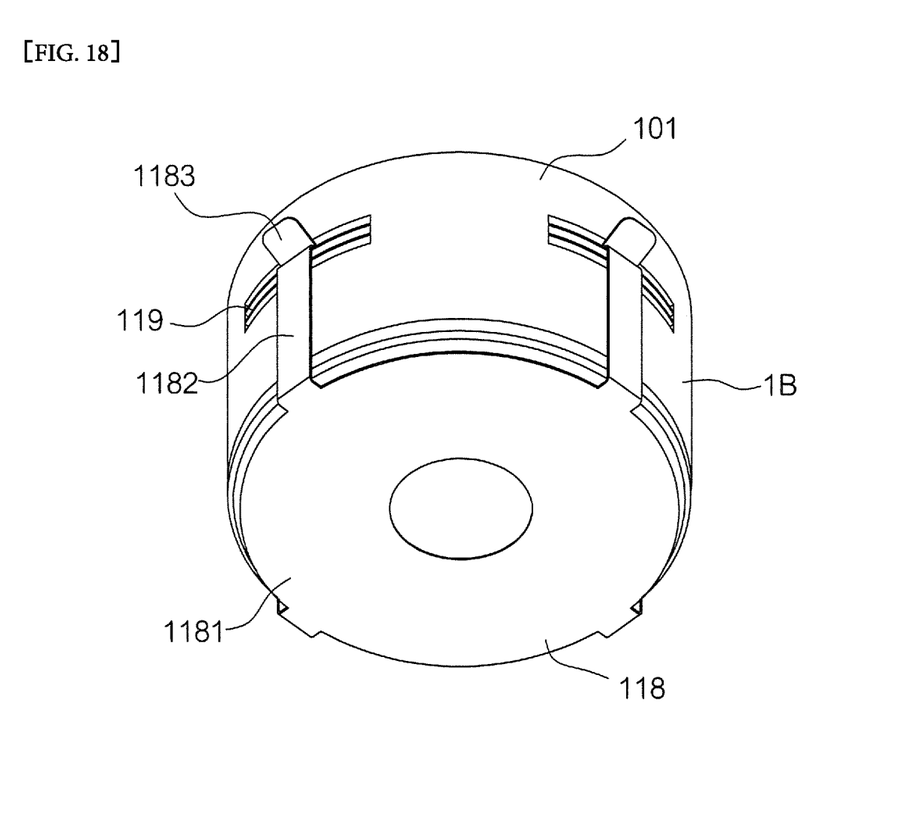
FIG. 18 is another perspective view from a different angle of swirl-flow forming body 1B to which annular plate 118 is detachably attached.

FIG. 17 is a perspective view of an example of swirl-flow forming body 1B to which annular plate 118, which is a modification of annular plate 117, is detachably attached. FIG. 18 is another perspective view of swirl-flow forming body 1B to which annular plate 118 is detachably attached, as seen from a different angle. Annular plate 118 shown in the figures differs from annular plate 117 in that annular plate 118 includes holding members that are fixed on the side surface of a main body of swirl-flow forming body 1B. The difference will be described in detail below.

Swirl-flow forming body 1B further includes four groove parts 119, compared to swirl-flow forming body 1. The groove parts 119 are formed on the side surface of main body 101 at regular intervals. The groove parts 119 are arranged nearer the top surface in relation to the center in the axial direction of side surface of main body 101. The groove parts 119 are shorter in the circumferential direction than a quarter of a circle of the outer periphery of first end face 103. Each of the groove parts 119 includes three V-shaped grooves (in other words, slits) that extend in the circumferential direction and are arranged in the axial direction. Claw part 1183 (described later) of annular plate 118 is engaged with each of the groove parts 119.

Annular plate 118 includes annular plate main body 1181 and four holding members 1182. A description of annular plate main body 1181 is omitted, as it is the same as that of annular plate 117. Each of the holding members 1182 is detachably fixed on main body 101 at one end thereof, and supports annular plate main body 1181 at the other end thereof such that annular plate main body 1181 opposes first end face 103. Annular plate main body 1181 and the holding members 1182 are integrally formed.

Holding members 1182 are formed by folding elongated plate spring materials that extend from the edge of annular plate main body 1181 at regular intervals, in a direction substantially perpendicular to annular plate main body 1181. The plate spring materials are longer than half the length in the axial direction of main body 101, and are shorter than the length in the axial direction of main body 101. The plate spring materials are folded at an angle such that main body 101 of swirl-flow forming body 1B to which annular plate 118 is attached is pressed at the side surface thereof due to restoring forces (or elastomeric forces) of the holding members 1182, so that main body 101 is held between the holding members 1182. Each of the holding members 1182 includes claw part 1183 at an end thereof, which is to be engaged with and fixed on groove part 119 of main body 101 due to a restoring force (or an elastomeric force) of holding member 1182, whereby a vertical position of annular plate 118 relative to swirl-flow forming body 1B is determined. Claw part 1183 is formed by bending one end of a plate spring material into a V-shape such that, when swirl-flow forming body 1B is provided with annular plate 118, claw part 1183 projects toward the side surface of main body 101.

Annular plate 118 described in the foregoing can be detachably attached to swirl-flow forming body 1B without using a tool.

Figure 19:
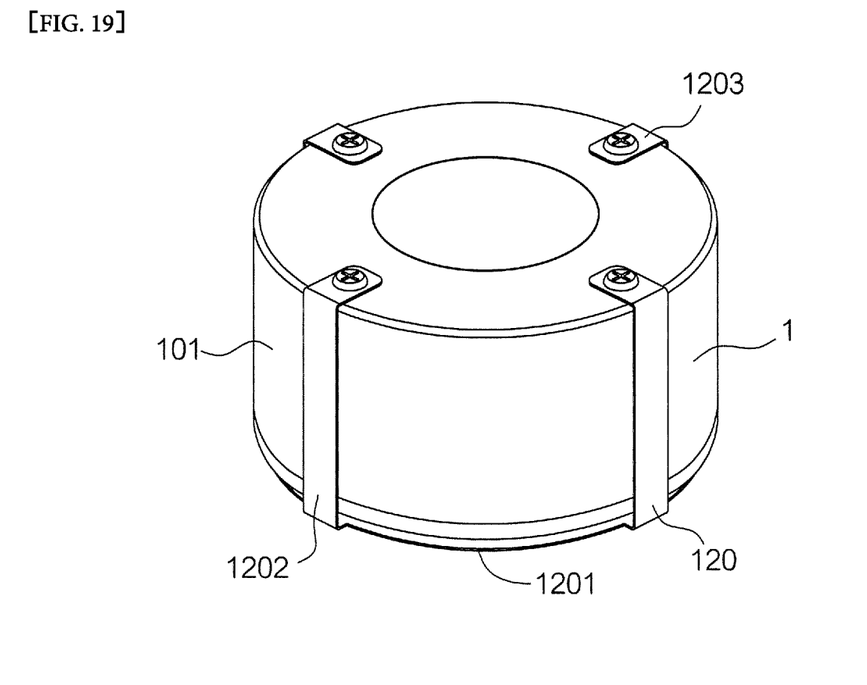
FIG. 19 is a perspective view of an example of swirl-flow forming body 1 to which annular plate 120 is detachably attached.

Now, FIG. 19 is a perspective view of an example of swirl-flow forming body 1 to which annular plate 120, which is a modification of annular plate 117, is detachably attached. Annular plate 120 shown in the figure differs from annular plate 117 in that each holding member 1202 has claw part 1203 that is fixed on the top surface of main body 101 of swirl-flow forming body 1 by use of screws, and that annular plate main body 1201 is detachably attached to swirl-flow forming body 1 by use of a tool. Claw part 1203 differs from claw part 1173 of annular plate 117 only in that claw part 1203 is formed in a flat shape. Since claw part 1203 is fixed on the top surface of main body 101 by use of screws, a vertical position of annular plate 120 relative to swirl-flow forming body 1 is determined. It is of note that claw part 1203 may be fixed on the top surface of main body 101 by use of a magnetic force or frictional force, instead of screws.

2-4. Modification 4

In the above embodiment, inner periphery 105 may have a different shape. For example, second end face 104 may include a chamfered or rounded opening edge (for example, refer to FIGS. 7 and 8 of published unexamined patent application number 2017-217733). In another example, a part of inner periphery 105 may not be tapered (for example, refer to FIGS. 9 to 11 of published unexamined patent application number 2017-217733).

2-5. Modification 5

Fluid passage 109 may be inclined in a direction approximately perpendicular to the central axis of main body 101 (for example, refer to FIG. 12 of published unexamined patent application number 2017-217733). More specifically, fluid passage 109 may extend from supply port 108 to jetting port 106 such that fluid passage 109 is inclined toward second end face 104. Thus formed fluid passage 109 guides a fluid discharged from jetting port 106, in a direction away from a target object (specifically, toward the opening of second end face 104), to be discharged from through-hole 102. It is of note that in a case where fluid passage 109 is not inclined, inner periphery 105 may not be tapered.

2-6. Modification 6

Swirl-flow forming device 1 may include, instead of spacers 112, a groove that is formed on a lower surface of cover 111 so as to discharge a fluid (for example, refer to FIGS. 13 and 14 of published unexamined patent application number 2017-217733). With cover 111 fixed on main body 101, a combination of the groove and second end face 104 forms two outlet ports that communicate with through-hole 102, two discharge ports that face toward the outside of swirl-flow forming body 1, and two straight fluid passages that allow a fluid to flow from the outlet port to the discharge port. In addition, swirl-flow forming body 1 may be provided with a member for controlling an amount of fluid to be discharged from the discharge port (for example, refer to FIGS. 15 and 16 of published unexamined patent application number 2017-217733).

In a case where spacers 112 are omitted as described in the present modified example, main body 101 and cover 111 may be integrally formed. In such a case, the two outlet ports are formed on an inner periphery of main body 101 integral with cover 111, and the two discharge ports are formed on an outer periphery of the same main body. The combination of main body 101 and cover 111 is an example of a "main body" according to the present invention.

2-7. Modification 7

Four spacers 112 may hold cover 111 movably, instead of holding cover 111 fixedly (for example, refer to FIG. 17 of published unexamined patent application number 2017-217733).

2-8. Modification 8

A plurality of swirl-flow forming bodies 1 may be used in combination (for example, refer to FIGS. 1 to 3, 18 to 31 of published unexamined patent application number 2017-217733).

2-9. Modification 9

The shape of the outer periphery of main body 101 of swirl-flow forming body 1 is not limited to being circular, and may be elliptical or rectangular. The taper formed in inner periphery 105 is not limited to a linear taper, and may be a parabolic or exponential taper. Alternatively, inner periphery 105 may include a stepped wall in such a manner that a cross-sectional area of through-hole 102 expands with distance from a member. Alternatively, inner periphery 105 may include a spiral groove for guiding a fluid that has flowed out of a jetting port toward the opening of second end face 104.

The cross-sectional shape of through-hole 102 is not limited to being circular, and may be elliptical or rectangular.

First end face 103 and second end face 104 may be uneven.

The number of jetting ports 106 is not limited to two, and may be fewer or may be more. Jetting ports 106 may be arranged other than on inner periphery 105 at the center in the axial direction of main body 101, and may be arranged nearer first end face 103 or second end face 104.

The number of fluid passages 109 is not limited to two, and may be fewer or may be more. Fluid passages 109 may be curved. The diameter of fluid passages 109 may not be constant.

The shape of the outer periphery and the inner periphery of flange portion 110 is not limited to being circular, and may be elliptical or rectangular. Flange portion 110 may be made from a metal such as an aluminum alloy or an elastic member such as a resin.

The shape of cover 111 is not limited to being circular, and may be elliptical or rectangular. Cover 111 may be smaller in size as long as cover 111 covers through-hole 102.

The shape of spacers 112 is not limited to being columnar, and may be a square or elliptical columnar shape. The number of spacers 112 is not limited to four, and may be fewer or may be more. The arrangement of spacers 112 is not limited to the example shown in FIGS. 1 to 3. For example, spacers 112 may extend from outer periphery 107. Spacers 112 may be provided on second end face 104 such that spacers 112 obstruct a flow path of a fluid flowing out of through-hole 102.

2-10. Modification 10

On first end face 103, a baffle plate (see JP 5908136 B, for example) that prevents a target object from entering through-hole 102 may be attached.

2-11. Modification 11

On first end face 103, friction members (see JP 2005-142462 A1, for example) for coming into contact with a target object to generate friction therebetween, which prevents the member from undulating or rotating, may be attached.

2-12. Modification 12

Instead of two fluid passages 109 of swirl-flow forming body 1, electric fans (see JP 2011-138948 A1, for example) may be used.

2-13. Modification 13

The direction in which a fluid flows out of through-hole 102 and flows along second end face 104 is not limited to the direction approximately perpendicular to the central axis of main body 101. For example, second end face 104 and cover 111 may be formed such that a fluid that has come out of through-hole 102 is discharged in a direction parallel to the central axis of main body 101 (specifically, in the upper direction relative to main body 101).

2-14. Modification 14

Figure 20:
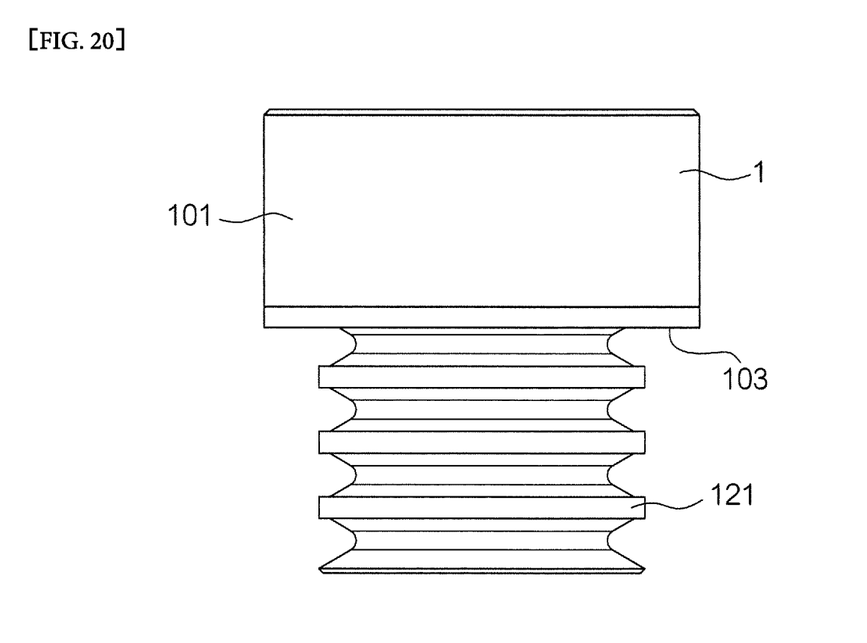
FIG. 20 is a side view of an example of swirl-flow forming body 1 to which cylindrical body 121 is attached.

On first end face 103, cylindrical body 121 may be attached to hold a target object. FIG. 20 is a side view of an example of swirl-flow forming body 1 that includes cylindrical body 121. Cylindrical body 121 shown in the figure is a bellows-shaped cylindrical body made of an elastic material such as rubber, and is a member for holding a target object to which suction is applied by swirl-flow forming body 1. An end of cylindrical body 121 is fixed on first end face 103 such that cylindrical body 121 allows passage of fluid to which suction is applied by negative pressure generated by swirl-flow forming body 1, and also prevents a target object from entering through-hole 102. Specifically, cylindrical body 121 is fixed on first end face 103 on the same axis as through-hole 102. Cylindrical body 121 has constricted parts whose inner diameter is smaller than the inner diameter of through-hole 102 and the maximum diameter of a target object. Another end of cylindrical body 121 is expanded toward a target object. The height of cylindrical body 121 depends on the flow amount of fluid supplied from the fluid supply pump to swirl-flow forming body 1, and on a type of a target object. It is of note that the shape of cylindrical body 121 is not limited to being cylindrical, and may be a square or elliptical columnar shape.

Cylindrical body 121 restricts inflow of surrounding fluid into swirl-flow forming body 1 applying suction to a target object, whereby swirl-flow forming body 1 can apply suction to the target object positioned away from the negative pressure generation area. The bellows shape of cylindrical body 121 enables cylindrical body 121 to deform according to a shape of a target object; accordingly, in a case where a misalignment occurs between swirl-flow forming body 1 and a target object, swirl-flow forming body 1 can hold the target object stably. Further, due to its bellows shape, cylindrical body 121 causes less damage to a target object in the event of contact with the target object. Furthermore, due to the bellows shape of cylindrical body 121, it is easier to secure a vertical clearance between swirl-flow forming body 1 and a target object, because expansion and contraction of cylindrical body 121 compensate for variations in height of target objects.

Cylindrical body 121 may have constricted parts whose inner diameter is smaller than or equal to one-half of the inner diameter of through-hole 102, whereby swirl-flow forming body 1 can convey a smaller target object. Cylindrical body 121 may have notches that are formed at an end of cylindrical body 121 at which a target object is held. The shape of the notches may include a sawtooth shape, and a semicircle, semi-oval, or rectangle shape. Swirl-flow forming body 1 may include, instead of cylindrical body 121, plural cylindrical bodies having a smaller diameter than cylindrical body 121, which are attached to first end face 103, whereby swirl-flow forming body 1 can convey plural target objects at the same time. Cylindrical body 121 may have a shape other than the bellows shape. Cylindrical body 121 may gradually taper off from the end facing first end face 103 to the end facing a target object.

The invention claimed is:

1. A swirl-flow forming body, comprising:
    a main body;
    an end face that is formed at the main body and faces a target object to which suction is applied;
    a hole that opens on the end face;
    a jetting port that is formed on an inner periphery of the main body, the inner periphery facing the hole;
    a fluid passage that allows fluid to be discharged into the hole via the jetting port so as to form a swirl flow that generates negative pressure; and
    a flange portion that is formed so as to protrude from the inner periphery, the flange portion allowing passage of fluid to which suction is applied by the negative pressure while preventing the fluid discharged via the jetting port from flowing out of the hole towards the target object, wherein the inner periphery is formed so as to guide the fluid discharged via the jetting port, in a direction away from the target object, to be discharged from the hole.

2. The swirl-flow forming body according to claim 1, wherein the flange portion comprises a protruding part that is formed at an end of the flange portion so as to protrude in a direction away from the target object.

3. The swirl-flow forming body according to claim 2, wherein
    the flange portion comprises a first end face that faces the target object, a second end face opposite to the first end surface, and a through-hole that opens on the first end face and the second end face.

4. The swirl-flow forming body according to claim 1, wherein
    the flange portion comprises a first end face that faces the target object, a second end face opposite to the first end surface, and a through-hole that opens on the first end face and the second end face.

5. A swirl-flow forming body, comprising:
    a main body;
    an end face that is formed at the main body and faces a target object to which suction is applied;
    a hole that opens on the end face;
    a jetting port that is formed on an inner periphery of the main body, the inner periphery facing the hole;
    a fluid passage that allows fluid to be discharged into the hole via the jetting port so as to form a swirl flow that generates negative pressure; and
    a flange portion that is formed so as to protrude from the inner periphery, the flange portion allowing passage of fluid to which suction is applied by the negative pressure while preventing the fluid discharged via the jetting port from flowing out of the hole towards the target object, wherein the fluid passage is formed so as to allow the fluid discharged via the jetting port to flow in a direction away from the target object to be discharged from the hole.

6. The swirl-flow forming body according to claim 5, wherein the flange portion comprises a protruding part that is formed at an end of the flange portion so as to protrude in a direction away from the target object.

7. The swirl-flow forming body according to claim 6, wherein
    the flange portion comprises a first end face that faces the target object, a second end face opposite to the first end surface, and a through-hole that opens on the first end face and the second end face.

8. The swirl-flow forming body according to claim 5, wherein
    the flange portion comprises a first end face that faces the target object, a second end face opposite to the first end surface, and a through-hole that opens on the first end face and the second end face.

* * * * *